(12) United States Patent
Imai et al.

(10) Patent No.: US 8,298,365 B2
(45) Date of Patent: Oct. 30, 2012

(54) STICKING METHOD AND STICKING APPARATUS

(75) Inventors: Hirofumi Imai, Kawasaki (JP); Koki Tamura, Kawasaki (JP); Takahiro Asai, Kawasaki (JP); Takahiro Yoshioka, Kawasaki (JP); Yoshihiro Inao, Kawasaki (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 181 days.

(21) Appl. No.: 12/796,872

(22) Filed: Jun. 9, 2010

(65) Prior Publication Data
US 2010/0314043 A1 Dec. 16, 2010

(30) Foreign Application Priority Data
Jun. 11, 2009 (JP) .................. 2009-140228

(51) Int. Cl.
*B32B 38/10* (2006.01)
*B32B 37/12* (2006.01)
(52) U.S. Cl. ......... 156/310; 156/247; 156/703; 156/930
(58) Field of Classification Search .................. 156/703, 156/704, 930, 941, 310
See application file for complete search history.

(56) References Cited

U.S. PATENT DOCUMENTS

| 5,291,502 A * | 3/1994 | Pezeshki et al. ............... 372/20 |
| 7,211,168 B2 * | 5/2007 | Miyanari ...................... 156/701 |
| 2005/0079284 A1 * | 4/2005 | Ivkovich et al. ............. 427/162 |
| 2007/0172585 A1 * | 7/2007 | Ivkovich et al. ............. 427/146 |
| 2011/0062111 A1 * | 3/2011 | Yeo et al. ...................... 216/24 |

FOREIGN PATENT DOCUMENTS
JP 2008-94957 4/2008
* cited by examiner

*Primary Examiner* — Mark A Osele
(74) *Attorney, Agent, or Firm* — Wenderoth, Lind & Ponack, L.L.P.

(57) ABSTRACT

A sticking method for sticking a support plate onto a substrate in such a way that the support plate can be removed in quickly and easily is provided. The sticking method according to the present invention includes the step of sticking a support plate 3 onto a wafer 2 via a first adhesive layer 4 provided on the wafer 2, a separate film 5 provided on the first adhesive layer 4, and a second adhesive layer 6, provided on the separation film layer 5, which either is higher in rate of dissolution in a solution than the first adhesive layer 4 or dissolves in a solvent different from the solvent in which the first adhesive layer 4 dissolves.

11 Claims, 2 Drawing Sheets

STICKING METHOD AND STICKING APPARATUS

This Nonprovisional application claims priority under 35 U.S.C. §119(a) on Patent Application No. 2009-140228 filed in Japan on Jun. 11, 2009, the entire contents of which are hereby incorporated by reference.

TECHNICAL FIELD

The present invention relates to a method and apparatus for sticking a supporting plate onto a substrate.

BACKGROUND ART

As a mobile phone, a digital AV device, an IC card, and the like product are improved in their functionality, it is increasingly demanded that a semiconductor chip (hereinafter referred to as "chip") which is to be mounted be downsized and thinned, so that the chip can be integrated in a package with higher density. In order to achieve high-density integration of the chip in the package, it is necessary to thin a thickness of the chip to a range from 25 μm to 150 μm.

However, a semiconductor wafer (hereinafter referred to as "wafer") from which the chip is produced is ground to have a thinner thickness and thereby has a weaker strength. As such, a crack is more likely to be formed in the wafer, or the wafer is more likely to be curbed. In addition, it is difficult to automatically transport the wafer having the weaker intensity due to the thin thickness. As such, it is required to manually transport the wafer, and thus, handling of the wafer becomes complex.

Accordingly, a wafer support system is developed in which a plate (so called a support plate) made of glass, rigid plastic, or the like material is stuck onto the wafer that is to be thinned, so that the strength of the wafer can be retained. This prevents formation of the crack and curbing of the wafer. Because the strength of the wafer can be maintained by the wafer support system, it is possible to automatically transport the thinned semiconductor wafer.

The support plate is stuck onto the wafer with an adhesive tape, a thermal plasticity resin, an adhesive agent, and the like. The wafer onto which the support plate has been stuck is thinned, and then, the support plate is removed from the substrate before dicing the wafer. For example, in a case where the support plate is stuck onto the wafer with the adhesive agent, the adhesive agent is dissolved so that the support plate is removed from the wafer.

Conventionally, in order to remove the support plate from the wafer by dissolving the adhesive agent, it takes some time to, for example, diffuse a solvent into the adhesive agent and dissolve the adhesive agent into the solvent. As a result, it takes long time to remove the support plate from the wafer. In order to solve such a problem, Patent literature 1 discloses a sticking method for sticking a support plate onto a wafer with an adhesive agent that allows easy removal.

Patent Literature 1 discloses an art in which workpieces are bonded to each other with an adhesive agent having a first adhesive layer and a second adhesive layer on the first adhesive layer, the first adhesive layer being formed from a first adhesive material in which thermally-dissolvable microcapsules each containing a release agent for reducing adhesibility of the first adhesive material have been dispersed and the second adhesive layer being formed from a second adhesive material in which thermally-expandable particles have been dispersed.

Patent Literature 1 teaches that the workpieces bonded to each other with the adhesive agent can be removed from each other by heating the adhesive agent so as to introduce the release agent from the microcapsules into the first adhesive layer and crack the first adhesive layer and the second adhesive layer due to a pressure by heat expansion of the thermally expandable particles. This allows separating the workpieces without leaving a residue of the adhesive agent on the workpieces.

CITATION LIST

Patent Literature 1

Japanese Patent Application Publication, Tokukai, No. 2008-94957 A (Publication Date: Apr. 24, 2008)

SUMMARY OF INVENTION

Technical Problem

It is necessary to remove of the support plate from the thinned wafer in less time to make sure that the thinned wafer will not be damaged. In a case where the support plate have been stuck onto the wafer as disclosed in Patent Literature 1, however, there is a high probability that the wafer is damaged due to the heat treatment and the pressure by the heat expansion of the thermally expandable particles. Further, the method suffers from such problems that the release agent contaminates the wafer and that the heat expandable particles in the adhesive layer reduce adhesibility of the adhesive layer.

As such, there is a demand for development of a method and apparatus for sticking a support plate onto a wafer in such a way that the wafer can be removed quickly and easily without damaging or contaminating the wafer.

The present invention is made in view of the problem, and an object of the present invention is to provide a method and apparatus for sticking a support plate onto a wafer in such a way that the wafer can be removed more quickly and easily.

Solution to Problem

A sticking method according to the present invention is a sticking method for sticking a support plate onto a substrate, the method including the step of sticking the support plate onto the substrate via a first adhesive layer provided on the substrate, a separation film layer provided on the first adhesive layer, and a second adhesive layer, provided on the separation film layer, which either is higher in rate of dissolution in a solution than the first adhesive layer or dissolves in a solvent different from the solvent in which the first adhesive layer dissolves.

A sticking apparatus according to the present invention is a sticking apparatus for sticking a support plate onto a substrate, the apparatus including sticking means for sticking the support plate onto the substrate via a first adhesive layer provided on the substrate, a separation film layer provided on the first adhesive layer, and a second adhesive layer, provided on the separation film layer, which either is higher in rate of dissolution in a solution than the first adhesive layer or dissolves in a solvent different from the solvent in which the first adhesive layer dissolves.

Advantageous Effects of Invention

A sticking method according to the present invention is a sticking method for sticking a support plate onto a substrate, the method including the step of sticking the support plate onto the substrate via a first adhesive layer provided on the substrate, a separation film layer provided on the first adhesive layer, and a second adhesive layer, provided on the separation film layer, which either is higher in rate of dissolution in a solution than the first adhesive layer or dissolves in a solvent different from the solvent in which the first adhesive layer dissolves. Therefore, the sticking method according to the present invention makes it possible to stick a support plate onto a substrate in such a way that the wafer can be removed quickly and easily by preventing the adhesive layers from being mixed together and preventing one of them from sinking into the other.

Additional objects, features, and strengths of the present invention will be made clear by the description below. Further, the advantages of the present invention will be evident from the following explanation in reference to the drawings.

DESCRIPTION OF EMBODIMENTS

Figure 1:
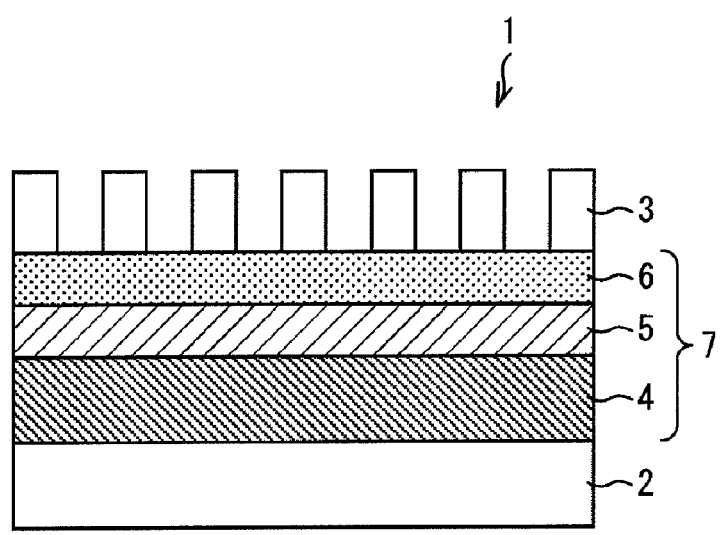
FIG. 1 is a cross-sectional view showing a laminate formed by a sticking method according to an embodiment of the present invention.

A sticking method according to an embodiment of the present invention is described below with reference to FIGS. 1 and 2. FIG. 1 is a cross-sectional view showing a laminate 1 formed by the sticking method according to the present invention, and FIG. 2 is a cross-sectional view showing steps in the sticking method according to the embodiment of the present invention.

The sticking method according to the present embodiment includes the step of sticking a support plate 3 onto a wafer 2 via a first adhesive layer 4 provided on the wafer 2, a separate film 5 provided on the first adhesive layer 4, and a second adhesive layer 6, provided on the separation film layer 5, which either is higher in rate of dissolution in a solution than the first adhesive layer 4 or dissolves in a solvent different from the solvent in which the first adhesive layer 4 dissolves.

[Laminate 1]

Figure 2:
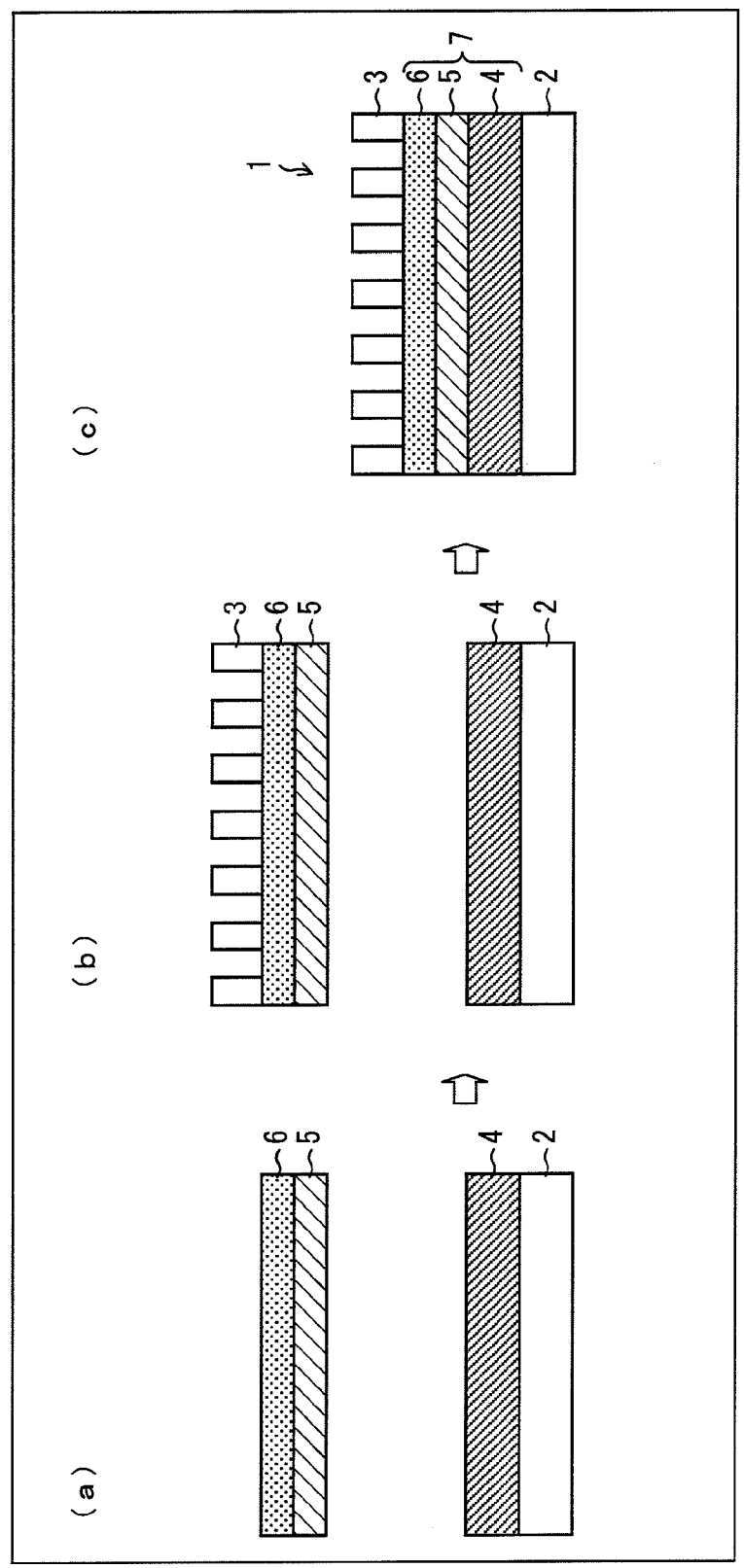
FIG. 2 is a cross-sectional view showing steps in the sticking method according to the embodiment of the present invention.

As shown in FIGS. 1 and 2, a laminate 1 that is formed by the sticking method according to the present invention includes a wafer (substrate) 2, a support plate 3, a first adhesive layer 4, a separate film (separation film layer) 5, and a second adhesive layer 6. In the laminate 1, the first adhesive layer 4, the separate film 5, and the second adhesive layer 6 constitute an adhesive laminate 7 that sticks the wafer 2 and the support plate 3 together.

In the present embodiment, the support plate 3 is a pored support plate 3 having through holes passing through the thickness of the support plate 3. However, the present invention is not limited to this. Use of the pored support plate 3 allows supplying the solvent to the second adhesive layer 6 via the through holes.

(First Adhesive Layer 4)

The first adhesive layer 4 adheres to the wafer 2 and the separate film 5. The first adhesive layer 4 should be formed by a first adhesive material containing an adhesive compound (first adhesive compound) capable of adequately joining the wafer 2 and the support plate 3 via the separate film 5 and the second adhesive layer 6. The first adhesive material may be a conventionally well-known adhesive material. Examples of the first adhesive material constituting the first adhesive layer 4 encompass a material containing an acrylic-styrene-type resin, a material containing a maleimide-type resin, and a material containing the like resin.

Examples of acrylic-styrene-type resin encompass a resin which is obtained by polymerizing monomers such as (i) styrene or a derivative of styrene, (ii) (meth)acrylic acid ester and/or the like.

Examples of the (meth)acrylic acid ester encompass (meth)acrylic acid alkyl ester having a chain structure, (meth)acrylic acid ester having an aliphatic ring, and (meth)acrylic acid ester having an aromatic ring. Examples of (meth)acrylic acid alkyl ester having the chain structure encompass acrylic-type long-chained alkyl ester having a carbon number in a range from 15 to 20, acrylic-type alkyl ester whose alkyl group has a carbon number in a range from 1 to 14, and the like acrylic-type alkyl ester. Examples of acrylic-type long-chained alkyl ester encompass acrylic acid alkyl ester and methacrylic acid alkyl ester, each having an alkyl group which is an n-pentadecyl group, an n-hexadecyl group, an n-heptadecyl group, an n-octadecyl group, an n-nonadecyl group, an n-eicosyl group, or the like group. Each of acrylic acid alkyl ester and methacrylic acid alkyl ester may have the alkyl group having a branched shape.

Examples of acrylic alkyl ester whose alkyl group has a carbon number in a range from 1 through 14 encompass well-known acrylic alkyl ester which is used in an existing acrylic adhesive agent. For examples, such acrylic alkyl ester encompasses acrylic acid alkyl ester and methacrylic acid alkyl ester, each having an alkyl group which is a methyl group, an ethyl group, a propyl group, a butyl group, a 2-ethyl hexyl group, an isooctyl group, an isononyl group, an isodesyl group, a dodecyl group, a lauryl group, a tridecyl group, or the like group.

Examples of (meth)acrylic acid ester having the aliphatic ring encompass cyclohexyl (meth)acrylate, cyclopentyl (meth)acrylate, 1-adamantyl (meth)acrylate, norbornyl (meth)acrylate, isobornyl (meth)acrylate, tricyclo decanyl (meth)acrylate, tetracyclododecanyl (meth)acrylate, dicyclopentanyl (meth)acrylate, and the like acrylate. Among them, isobornyl methacrylate and dicyclopentanyl methacrylate are more preferable.

(Meth)acrylic acid ester having the aromatic group is not particularly limited. Examples of the aromatic group encompass a phenyl group, a benzyl group, a tolyl group, a xylyl group, a biphenyl group, a naphthyl group, an anthracenyl group, a phenoxymethyl group, a phenoxyethyl group, and the like group. The aromatic group may have a chained alkyl group having a carbon number in a range from 1 through 5 or a branched alkyl group having a carbon number in a range from 1 through 5. Specifically, phenoxyethyl acrylate is preferable.

An example of the maleimide resin encompasses a resin which is obtained by polymerizing a monomer such as maleimide having an alkyl group, maleimide having an aliphatic hydrocarbon group, aromatic maleimide having an aryl group, or the like maleimide. Maleimide having the alkyl group may be N-methyl maleimide, N-ethyl maleimide, N-n-propyl maleimide, N-isopropyl maleimide, N-n-butyl maleimide, N-isobutyl maleimide, N-sec-butyl maleimide, N-tert-butyl maleimide, N-n-pentyl maleimide, N-n-hexyl maleimide, N-n-heptyl maleimide, N-n-octyl maleimide, N-lauryl maleimide, N-stearyl maleimide, or the like maleimide. Maleimide having the aliphatic hydrocarbon group may be N-cyclopropyl maleimide, N-cyclobutyl maleimide, N-cyclopentyl maleimide, N-cyclohexyl maleimide, N-cycloheptyl maleimide, N-cyclooctyl maleimide, or the like maleimide. Aromatic maleimide having the aryl group may be N-phenyl maleimide, N-m-methylphenyl maleimide, N-o-methylphenyl maleimide, N-p-methylphenyl maleimide, or the like maleimide.

A film thickness of the first adhesive layer 4 is preferably in a range from 15 μM to 30 μm, and is particularly preferably 15 μm, so that adhesion between the wafer 2 and the support plate 3 as well as thermal resistance will be maintained. However, the present invention is not limited to this. The first adhesive layer 4 can be formed by (i) applying, on the wafer 2, the first adhesive material containing the adhesive compound, and then (ii) hardening the first adhesive material into a layer on the wafer 2. Alternatively, the first adhesive layer 4 can be formed by (i) hardening the first adhesive material into a layer in advance and then (ii) transporting the layer onto the wafer 2.

(Second Adhesive Layer 6)

The second adhesive layer 6, located on the support plate 3, sticks the support plate 3 and the separate film 5 together. The second adhesive layer 6 is formed in such a manner as to be higher in rate of dissolution in a solvent than the first adhesive layer 4 or in such a manner as to dissolve in a solvent different from the solvent in which the first adhesive layer 4 dissolves.

The second adhesive layer 6 that is higher in rate of dissolution in a solvent than the first adhesive layer 4 is intended to be formed by a highly dissoluble second adhesive material. The second adhesive layer 6 can be formed by a second adhesive material containing an adhesive compound (second adhesive compound) that is smaller in average molecular weight than the adhesive compound contained in the first adhesive material.

The second adhesive layer 6, formed in such a manner as to be higher in rate of dissolution in a solvent than the first adhesive layer 4, allows the support plate 3, bonded to the wafer 2 using the second adhesive layer 6, to be removed from the wafer 2 more quickly by dissolving the second adhesive layer 6, which is higher in rate of dissolution, more quickly by supplying the solvent to the second adhesive layer 6 through the through-holes in the support plate 3. After the support plate 3 is removed, the separate film 5 is removed and the first adhesive layer 4 is dissolved. Therefore, the support plate 3 will not hinder permeation of the solvent into the first adhesive layer 4. As a result, the first adhesive layer 4 can also be dissolved quickly.

The second adhesive layer 6 that is higher in rate of dissolution in a solvent than the first adhesive layer 4 is preferably formed by a second adhesive material containing an adhesive compound whose average molecular weight corresponds to 10% to 30% of the average molecular weight of the adhesive compound contained in the first adhesive layer 4. This makes it possible to obtain a rate of dissolution at a sufficient level to shorten the removal time.

In a case where the first adhesive layer 4 is formed by a conventionally-used typical first adhesive material, the second adhesive layer 6 should be formed from a second adhesive material containing an adhesive compound whose average molecular weight is in a range from 5,000 to 10,000. For example, in a case where the first adhesive layer 4 is formed from a first adhesive material containing an adhesive compound whose average molecular weight is 40,000, the second adhesive layer 6 can be formed from a second adhesive material containing an adhesive compound whose average molecular weight is 10,000.

The second adhesive layer 6 that dissolves in a solvent different from the solvent in which the first adhesive layer 4 dissolves is intended to be formed by a second adhesive material that is resistant to the solvent in which the first adhesive layer 4 dissolves. The second adhesive layer 6 is preferably formed by a second adhesive material that is higher in rate of dissolution in a solvent different from the solvent in which the first adhesive layer 4 dissolves.

The second adhesive layer 6 formed in such a manner as to dissolve in a solvent different from the solvent in which the first adhesive layer 4 dissolves allows the support plate 3, bonded using the second adhesive layer 6, to be removed from the wafer 2 by dissolving only the second adhesive layer 6 in the solvent, which dissolves the second adhesive layer 6, by supplying the solvent to the second adhesive layer 6 through the through-holes in the support plate 3. After the support plate 3 is removed, the separate film 5 is removed and the first adhesive layer 4 is dissolved. Therefore, the support plate 3 will not hinder permeation of the solvent into the first adhesive layer 4. As a result, the first adhesive layer 4 can also be dissolved quickly.

Because the pored support plate 3 is used in the present embodiment, a solvent (e.g., a back rinse agent for use in a photolithography process) may reach the second adhesive layer 6 via the though-holes in the support plate 3 during a thinning process for the wafer 2. However, a typical adhesive layer (such as the first adhesive layer 4) for sticking the wafer 2 and the support plate 3 together exhibits no resistance to a solvent containing an organic solvent PGMEA (propylene glycol monomethyl ether acetate), HP (2-heptanone), or the like. As such, in a case where such solvent reaches the typical layer via the through-holes in the support plate 3, the typical adhesive layer is dissolved. This results in delamination of the support plate 3 from the wafer 2, thereby causing such a problem that the thinning process cannot be carried out in a good manner. In order to solve the problem, there has conventionally been such a configuration that, during a process in which there is a risk that the solvent reaches the adhesive layer, the through-holes in the support plate 3 are sealed with a back tape so that the solvent can be prevented from flowing thereinto. However, such a configuration is not preferable because it leads to deterioration in processing efficiency and cost increases.

In the present invention, the second adhesive layer 6 being resistant to the solvent containing such an organic solvent as described above is formed onto the support plate 3, so that the first adhesive layer 4 is covered by the second adhesive layer 6. As such, even in a case where the solvent diffuses via the through-holes in the support plate 3, neither the first adhesive layer 4 nor the second adhesive layer 6 is dissolved, thereby preventing delamination of the support plate 3 from the wafer 2. This makes it unnecessary to seal the through-holes in the support plate 3 with a back tape.

The second adhesive layer 6 should be formed in such a manner as to dissolve in a solvent different from the solvent in which the first adhesive layer 4 dissolves. In a case where the first adhesive layer 4 is formed by a first adhesive material that dissolves in an organic solvent, the second adhesive layer 6 should be formed by a second adhesive material that is resistant to the organic solvent. An adhesive compound contained in such an adhesive compound (second adhesive compound) can be a nonpolar-solvent dissolvable compound or a highly-polar-solvent dissolvable (e.g., water-soluble) compound. Examples of the nonpolar-solvent dissolvable compound encompass a hydrocarbon resin. Examples of the hydrocarbon resin encompass, but are not limited to, a resin having constituent units derived from cycloolefin, a terpene resin, and the like. Further, examples of the resin having constituent units derived from cycloolefin encompass, but are not limited to, a cycloolefin polymer (hereinafter referred to sometime as "resin (A)").

The resin (A) is a resin which is obtained by polymerizing a monomeric component including a cycloolefin monomer (a1). Concrete examples of the resin (A) encompass: a monomeric compound open-ring (co)polymer including the cycloolefin monomer (a1); a resin to which the monomeric compound including the cycloolefin monomer (a1) is additionally (co)polymerized; and the like.

Examples of the cycloolefin monomer included in the monomeric compound composing the resin (A) encompass: bicyclics such as norborenen, norbornadiene, and the like; tricyclics such as dicyclopentadiene, dihydroxypentadiene, and the like; tetracyclics such as tetracyclododecene and the like; pentacyclics such as cyclopentadiene trimer and the like; heptacyclics such as tetracyclopentadiene and the like; a substituted alkyl (methyl, ethyl, butyl, or the like) of above polycyclics, a substituted alkenyl (such as vinyl or the like) thereof, a substituted alkylidene (ethylidene) thereof, a substituted aryl (phenyl, tolyl, naphthyl, or the like) thereof; and the like. Among them, a norbornene monomer selected from the group consisting of norbornene, tetracyclododecene, and a substituted alkyl of these and shown by the following general formula (1) is particularly preferable.

[Chem. 1]

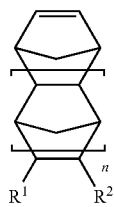

(1)

(where each of $R^1$ and $R^2$ is, independently, either a hydrogen atom or an alkyl group having a carbon number in a range from 1 through 5, and n=0 or 1)

The monomeric compound for constituting the resin (A) can include another monomer which is copolymerizable with the cycloolefin monomer (a1). For example, it is preferable that the above monomeric compound also include an alkene monomer (a2) shown by the following general formula (2). Examples of the alkene monomer encompass ethylene, α-olefin, and the like. The alkene monomer (a2) can be a linear monomer or a branched monomer.

[Chem. 2]

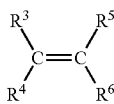

(2)

(where each of $R^3$ through $R^6$ is, independently, either a hydrogen atom or an alkyl group having a carbon number in a range from 1 through 5.)

The monomeric compound for constituting the resin (A) includes cycloolefin monomer (a1) preferably in a range of 50% by mass or more, and more preferably in a range of 60% by mass or more. In a case where the above monomeric compound includes the cycloolefin monomer (a1) in the range of 50% by mass or more of its total mass, an adhesive strength at high temperature will be good.

For prevention of gas generation at high temperature, it is preferable that the resin (A) be a resin having no polar radical, like a resin to be obtained by polymerizing the monomeric component such as the cycloolefin monomer (a1) shown by the general formula (1) and the alkene monomer (a2) shown by the general formula (a2).

Neither a polymerization method nor a polymerization condition for polymerizing the above monomeric components is particularly limited. The polymerization method and the polymerization condition should be set as appropriate by the law of the art.

Examples of a commercially available product which is usable as the resin (A) encompass "TOPAS" manufactured by Polyplastics Co., Ltd., "APEL" manufactured by Mitsui Chemicals, Inc, "ZEONOR" and "ZEONEX" manufactured by Zeon Corporation, "ARTON" manufactured by JSR Corporation, and the like product.

A glass transition point for the resin (A) is preferably 60° C. or higher, and particularly preferably 70° C. or higher. In a case where the resin (A) has the glass transition point of 60° C. or higher, the adhesive layer can be prevented from being softened even when an adhesive composition is exposed under high-temperature environment.

Examples of the terpene-type resin (hereinafter referred to sometimes as "resin (B)") encompass a terpene resin, a terpene phenol resin, a modified terpene resin, a hydrogenated terpene resin, a hydrogenated terpene phenol resin, and the like. Among them, the hydrogenated terpene resin is preferable.

It is important that the resin (B) have a softening point of 80° C. to 160° C. If the resin (B) has a softening point of lower that 80° C., the adhesive composition is softened when exposed under high-temperature environment, whereby there occurs an adhesion failure. On the other hand, if the resin (B) has a softening point of higher than 160° C., there will be a decrease in rate of removal at which the adhesive composition is removed.

It is important that the resin (B) have a molecular weight of 300 to 3,000. If the resin (B) has a molecular weight of less than 300, the resin (B) become insufficient in thermal resistance, whereby there will be a decrease in degassing amount under high-temperature environment. On the other hand, if the resin (B) has a molecular weight of greater than 3,000, there will be a decrease in rate of removal at which the adhesive composition is removed. In the present invention, the molecular weight of the resin (B) is a molecular weight based on polystyrene according to gel permeation chromatography (GPC).

The resin (A) and the resin (B) can be used alone or in combination. When the resin (A) and the resin (B) are used in combination, the blend ratio between the resin (A) and the resin (B) ranges from (A):(B)=80:20 to 55:45 (mass ratio). If the resin (A) exceeds the range (i.e., if the resin (B) falls far short of the range), there will be a decrease in rate of removal at which the adhesive composition is removed. If the resin (A) falls far short of the range (i.e., if the resin (B) exceeds the range), the adhesive composition is softened when exposed under high-temperature environment, whereby there occurs an adhesion failure.

Examples of the highly-polar-solvent dissoluble compound encompass, but are not limited to, collagen peptide, cellulose, polyvinyl alcohol (PVA), amylum, and the like.

Collagen peptide can be obtained by hydrolyzing collagen molecules whose helical structure formed of polypeptide strands has been partly loosened and thereby gelatinized due to thermal modification. Preferably usable examples of the collagen molecules are a mammal-derived collagen molecule and a fin-derived collagen molecule. The collagen molecules can be commercially available collagen molecules, but it is preferable that the collagen molecules be collagen molecules from which collagen peptide having a dissolution rate to a polar solvent of a range from 100 to 300 nm/sec can be obtained. It is particularly preferable that the collagen molecules be collagen molecules from which collagen peptide having a dissolution rate to the solvent of 200 nm/sec can be obtained.

For the second adhesive material to constitute the second adhesive layer 6, a material suitable with the treatment to be performed onto the laminate 1 should be selected as appropriate. For example, in a case where a large volume of water is used during the thinning process for the wafer 2, it is preferable to use a hydrocarbon resin as the second adhesive material, because the second adhesive material made from a water-dissolvable compound constitutes the second adhesive layer 6 which is possibly dissolved in water.

It is preferable that the second adhesive layer 6 have a film thickness thinner than the first adhesive layer 4 and corresponding to 10% to 20% of a total film thickness of the adhesive laminate 7, so that (i) the adhesion between the wafer 2 and the support plate 3 and (ii) the thermal resistance will be maintained. However, the present invention is not limited to this. In a case where, for example, the first adhesive layer 4 has a film thickness of 15 µm, the second adhesive layer 6 can have a film thickness of 3 µm. The second adhesive layer 6 can be formed by: applying, onto the separate film 5, the second adhesive material containing the adhesive compound; and hardening the second adhesive material into a layer on the first adhesive layer 4. The second adhesive layer 6 can be alternatively formed by: hardening the second adhesive material into a layer; and transporting the layer onto the separate film 5.

(Separate Film 5)

The separate film 5, located between the first adhesive layer 4 and the second adhesive layer 6, serves to separate the first adhesive layer 4 from the second adhesive layer 6. That is, the separate film 5 both prevents the first adhesive layer 4 and the second adhesive layer 6 from being mixed together and prevents one of them from sinking into the other. Therefore, the separate film 5 only needs to be formed by a material capable of preventing the first adhesive layer 4 from the second adhesive layer 6 from being mixed together and preventing one of them from sinking into the other.

Further, it is preferable that the separate film 5 be formed by a material that is resistant to both the solvent that dissolves the first adhesive material constituting the first adhesive layer 4 and the solvent that dissolves the second adhesive material constituting the second adhesive layer 6. This makes it easy to apply the material constituting the separate film 5 onto the first adhesive layer 4 and the second adhesive layer 6, thereby making it easy to form the adhesive laminate 7. This makes it easy to stick the support plate 3 onto the wafer 2. Furthermore, it is preferable that the separate film 5 be a separate film having a predetermined level of thermal resistance to contract less with heat.

It is preferable that the separate film 5 be formed by a film containing a resin selected from the group consisting of a polyethylene resin, a polyimde resin (PI), a polyamide resin, polyethylene terephthalate (polyester resin (PET)), polyphenylene sulfide, polyethylene naphthalate (PEN), a polypropylene resin, polybutylene resin, nylon, and a polylactide resin.

It is preferable that the separate film 5 have a layer thickness of 5 µm to 50 µm in order to prevent the first adhesive layer 4 and the second adhesive layer 6 from being mixed together and prevent one of them from sinking into the other and to maintain the adhesion between the wafer 2 and the support plate 3 and the thermal resistance; however, the present invention is not limited to this. The separate film 5 may be a separate film obtained by forming such a resin as described above into a film.

(Sticking Method)

In the sticking method according to the present embodiment, the support plate 3 is stuck onto the wafer 2 by forming the first adhesive layer 4 on the wafer 2, forming the separate film 5 on the first adhesive layer 4, forming the second adhesive layer 6 on the separate film 5, and then bonding the support plate 3 onto the second adhesive layer 6. The sticking method according to the present invention may be carried out by a sticking apparatus including sticking means for sticking a support plate 3 onto a wafer 2 as described above.

Alternatively, the support plate 3 may be stuck onto the wafer 2 by forming the second adhesive layer 6 on the support plate 3, forming the separate film 5 on the second adhesive layer 6, forming the first adhesive layer 4 on the separate film 5, and then bonding the wafer 2 onto the first adhesive layer 4. Alternatively, the support plate 3 may be stuck onto the wafer 2 by forming the first adhesive layer 4 on the wafer 2, forming the second adhesive layer 6 on the separate film 5, bonding the support plate 3 the second adhesive layer 6 together, and then bonding the first adhesive layer 4 and the separate film 5 together.

In the following, a process flow of the sticking method according to the present invention is described with reference to (a) to (c) of FIG. 2. The sticking method according to the present embodiment only needs to include the aforementioned sticking step, and may include, before the sticking step, either the step of forming the first adhesive layer 4 on the wafer 2 or the step of forming the second adhesive layer 6 on the support plate 3. The sticking method described in the present embodiment includes both the first adhesive layer forming step and the second adhesive layer forming step.

In the sticking step according to the present embodiment, first, the first adhesive layer 4 is formed on the wafer 2 as shown in (a) of FIG. 2. Further, the second adhesive layer 6 is formed on the separate film 5. Next, as shown in (b) of FIG. 2, the support plate 3 is stuck onto the second adhesive layer 6 formed on the separate film 5. Then, as shown in (c) of FIG. 2, the laminate 1 is formed by bonding (i) the first adhesive layer 4 formed on the wafer 4 and (ii) the separate film 5 having the support plate 3 stuck thereonto via the second adhesive layer 6.

Since the separate film 5 is provided between the first adhesive layer 4 and the second adhesive layer 6, even high-temperature treatment of the laminate 1, for example, does not cause such a problem that the first adhesive layer 4 and the second adhesive layer 6 are mixed together or one of them sinks into the other. Such mixing together of the first adhesive layer 4 and the second adhesive layer 6 or such sinking of one of them into the other makes it difficult to remove the support plate 3 from the wafer 2. Therefore, the prevention of such a problem makes it possible to remove the support plate 3 from the wafer 2 quickly and easily.

(Removal Method)

The following describes a process by which the support plate 3 is removed from the wafer 2 after a predetermined treatment, such as thinning treatment of the wafer 2, is performed on the laminate 1 formed by the sticking method according to the present embodiment.

The solvent that dissolves the second adhesive layer 6 is injected into the laminate 1, which is a target of the removal treatment, from that side of the support plate 3 which is not in contact with the second adhesive layer 6. Alternatively, the laminate 1 is immersed in the solvent. The solvent flows in through the through-holes in the support plate 3 and permeates into the second adhesive layer 6 to dissolve the second adhesive layer 6.

In this case, the solvent that dissolves the second adhesive layer 6 is selected as appropriate in accordance with the properties of the second adhesive layer 6. In a case where the second adhesive layer 6 is formed by a second adhesive material containing an adhesive compound that is smaller in average molecular weight than the adhesive compound contained in the first adhesive material, the solvent that dissolves the second adhesive layer 6 can be the same as the solvent in which the first adhesive layer 4 dissolves. Such a solvent is preferably a solvent whose solubility parameter (SP value) is greater than 8 and less than 10. Examples of the solvent encompass PGMEA, HP, and the like.

On the other hand, in a case where the second adhesive layer 6 is formed by a hydrocarbon resin, a nonpolar solvent having an SP value of 8 or less is preferably usable as the solvent, In this case, it is more preferable that a nonpolar solvent having an SP value of 7.4 or less is be used. Examples of the nonpolar solvent having an SP value of 7.4 or less encompass hydrocarbon-type (terpene-type) solvents (such as menthane, limonene, and pinene), toluene, xylene, n-hexane, isohexane, cyclohexane, methylcyclohexane, n-heptane, octane, nonane, fluorinated solvents, and the like.

Furthermore, in a case where the second adhesive layer 6 is formed by a highly-polar-solvent dissolvable compound (e.g., water-dissolvable compound), a conventionally well-known polar solvent is preferably usable as the solvent. In this case, it is preferable that a polar solvent having an SP value of 10 or greater be used, and more preferable that a polar solvent having an SP value of 12 or greater be used. Examples of the solvent having the SP value of 12 or greater encompass water, methanol, ethanol, isopropyl alcohol, and the like. Next, after the second adhesive layer 6 is dissolved, the support plate 3 is removed and the separate film 5 is removed.

Subsequently, the solvent in which the first adhesive layer 4 is dissolved is poured onto an entire surface of the first adhesive layer 4. This can produce the wafer 2 from which the support plate 3, the first adhesive layer 4, and the second adhesive layer 5 have been removed. An undissolved portion of the second adhesive layer 6 may be removed by washing the wafer 2. As mentioned above, when the second adhesive material is a material containing an adhesive compound that is smaller in average molecular weight than the adhesive compound contained in the first adhesive material, the solvent that dissolves the first adhesive layer 4 can be the same as the solvent that dissolves the second adhesive layer 6.

As mentioned above, the sticking method according to the present embodiment for sticking the support plate 3 onto the wafer 2 allows the support plate 3, bonded using the second adhesive layer 6, to be removed from the wafer 2 by dissolving the second adhesive layer 6 in the solvent, which dissolves the second adhesive layer 6, more quickly by supplying the solvent to the second adhesive layer 6 through the through-holes in the support plate 3. After the support plate 3 is removed, the separate film 5 is removed and the first adhesive layer 4 is dissolved. Therefore, the support plate 3 will not hinder permeation of the solvent into the first adhesive layer 4. As a result, the first adhesive layer 4 can also be dissolved quickly.

EXAMPLES

The removability, crack resistance, sunk thickness, and solvent resistance of laminates 1 formed by the sticking method according to the present embodiment were evaluated. Further, the contraction of the separate films 5 used was also evaluated.

(Preparation of Adhesive Materials)

Resins 1 to 3 were synthesized by conventional radical polymerization, with the monomers blended in amounts shown below in Table 1.

TABLE 1

| Monomers | Resin 1 | Resin 2 | Resin 3 |
| | Blending amounts (parts by mass) | | |
| --- | --- | --- | --- |
| Methyl methacrylate | 10 | 10 | 15 |
| n-butyl methacrylate | 10 | 10 | — |
| Styrene | 52 | 52 | 62 |
| Isobornyl methacrylate | 5 | 5 | 10 |
| Dicyclopentanyl methacrylate | 13 | 13 | — |
| Acrylic acid | — | — | 5 |
| Mass average molecular weight | 40,000 | 10,000 | 83,000 |
| Dispersivity | 7.6 | 4.7 | 13.5 |

In Table 1, the term "mass average molecular weight" means a mass average molecular weight based on standard styrene according to GPC measurement.

The resin 1 (100 parts by mass) was dissolved in PGMEA, whereby an adhesive composition 1 containing the resin 1 in a mass concentration of 40% by mass was prepared. Further, the resin 2 (100 parts by mass) was dissolved in PGMEA, whereby an adhesive composition 2 containing the resin 2 in a mass concentration of 40% by mass was prepared. Furthermore, the resin 3 (100 parts by mass) was dissolved in PGMEA, whereby an adhesive composition 3 containing the resin 3 in a mass concentration of 40% by mass was prepared.

Further prepared were adhesive compositions 4 to 6 containing resins 4 to 6 (manufactured by Polyplastics Co., Ltd.) containing repeating units represented by chemical formulas (3) and (4) with mass ratios shown below in Table 2, respectively.

[Chem. 3]

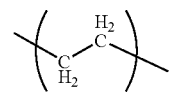

(3)

[Chem. 4]

(4)

TABLE 2

| | Resin 4 (TOPAS8007) | Resin 5 (TOPAS5013) | Resin 6 (TOPAS6015) |
| --- | --- | --- | --- |
| Chemical formula (3):chemical formula (4) [mass ratio] | 35:65 | 24:76 | 20:80 |
| Mass average molecular weight | 98,200 | 85,100 | 83,300 |
| Dispersivity | 1.69 | 1.65 | 1.72 |

Further prepared as separate films 5 were a 19-μm or 25-μm polyimide film (PI) film (marketed as "Kapton"; manufactured by DU PONT-TORAY Co., Ltd.), a polyethylene terephthalate (PET) film (marketed as "Teijin Tetron Film"; manufactured by Teijin DuPont Films), and polyethylene naphthalate (PEN) film (marketed as "Teonex", manufactured by Teijin DuPont Films).

Examples 1 to 15

With the PET film, the PEN film, or the PI film used as a separate film 5, the adhesive composition 2, 4, 5, or 6 was applied onto the separate film 5 by an applicator and dried for five minutes at 80° C. to form a second adhesive layer 6 having a thickness of 10 μm. A support plate 3 was bonded onto the second adhesive layer 6 formed on the separate film 5, and the separate film 5 was laminated onto the support plate 3 by a laminator at a pressure of 2.0 kg/cm$^2$, a speed of 0.5 m/min, and a temperature of 120° C.

Next, a 5-inch silicon wafer 2 was spin-coated with the adhesive composition 1 or 3, which was then dried for five minutes at 80° C. to form a first adhesive layer 4 having a thickness of 50 μm. Then, the separate film 5, onto which the support plate 3 had been laminated, was stuck onto the first adhesive layer 4 formed on the wafer 2, whereby a laminate 1 was formed. Table 3 shows combinations of materials used to form the laminates 1 in Examples.

laminate 7 after heating was 10 μm or less. The amount of sinking in the adhesive laminate 7 was extremely small. The evaluation of sinking yielded a good result.

(Evaluation of Solvent Resistance)

The solvent resistance of each of the laminates 1 of Examples 1 to 15 to water ($H_2O$), isopropyl alcohol (IPA), PGMEA, N-methyl-2-pyrrolidone (NMP), dimethyl sulfoxide (DMSO), tetramethylammonium hydroxide (TMAH) (2.38% by mass), NaOH (1% by mass), and hydrogen fluoride (HF) (1% by mass) was evaluated. Each of the laminates 1 of Examples 1 to 15 was immersed in each of these solvents. In each of Examples 1 of 15, the adhesive laminate 7 did not dissolve in any of these solvents and therefore had resistance to the solvents.

(Evaluation of Film Contraction)

The evaluation of film contraction was carried out by heating the laminates 1 of Examples 1 to 15 for one hour at 200° C. and then observing the contraction state of the separate films 5. In Examples 1, 2, 7, 8, 10, and 13, the separate films 5 slightly contracted. In the other examples, the separate films 5 did not contract.

Examples 16 to 21

The separate films 5 used were PEN films. The second adhesive layers 6 were each formed by a material obtained by mixing a terpene resin A (manufactured by Yasuhara Chemi-

TABLE 3

|  | Example 1 | Example 2 | Example 3 | Example 4 | Example 5 | Example 6 | Example 7 | Example 8 |
|---|---|---|---|---|---|---|---|---|
| First adhesive layer | Resin 1 | Resin 3 | Resin 1 | Resin 3 | Resin 1 | Resin 3 | Resin 1 | Resin 3 |
| Separate film | PET(19 μm) | PET(19 μm) | PEN(25 μm) | PEN(25 μm) | PI(25 μm) | PI(25 μm) | PET(19 μm) | PET(19 μm) |
| Second adhesive layer | Resin 2 | Resin 2 | Resin 2 | Resin 4 | Resin 4 | Resin 4 | Resin 4 | Resin 4 |

|  | Example 9 | Example 10 | Example 11 | Example 12 | Example 13 | Example 14 | Example 15 |
|---|---|---|---|---|---|---|---|
| First adhesive layer | Resin 1 | Resin 1 | Resin 1 | Resin 1 | Resin 1 | Resin 1 | Resin 1 |
| Separate film | PEN(25 μm) | PET(19 μm) | PEN(25 μm) | PI(25 μm) | PET(19 μm) | PEN(25 μm) | PI(25 μm) |
| Second adhesive layer | Resin 4 | Resin 5 | Resin 5 | Resin 5 | Resin 6 | Resin 6 | Resin 6 |

(Evaluation of Removability)

The evaluation of removability was carried out by heating the laminates 1 of Examples 1 to 15 for one hour at 200° C., immersing the laminates 1 of Examples 1 to 3 and the laminates 1 of Examples 4 to 15 in 2-heptanone and p-menthane, respectively, subjecting them to ultrasonic treatment, and then removing the separate films 5. In each of Examples 1 to 15, the support plate 3 was removed from the wafer 2 satisfactorily.

(Evaluation of Crack Resistance)

The laminates 1 of Examples 1 to 15 were formed so that their respective first adhesive layers 4 were 50 μm thick. These layers were checked with eyes for cracks. Examples 1 to 15 were all found to be free of cracks and therefore satisfactory in crack resistance.

(Evaluation of Sinking)

The evaluation of sinking was carried out by making a comparison between the thickness of the adhesive laminate 7 before heating of each of the laminates 1 of Examples 1 to 15 and the thickness of the adhesive laminate 7 after heating of the laminate 1 for one hour at 200° C. In each of Examples 1 to 15, the difference between the thickness of the adhesive laminate 7 before heating and the thickness of the adhesive cal Co., Ltd.; Clearon P135; hydrogenerated terpene resin) having a softening point of 135° C. and a molecular weight of 820, a terpene resin B (manufactured by Yasuhara Chemical Co., Ltd.; Clearon P115; hydrogenerated terpene resin) having a softening point of 115° C. and a molecular weight of 650, or a terpene resin C (manufactured by Yasuhara Chemical Co., Ltd.; Clearon P105; hydrogenerated terpene resin) having a softening point of 105° C. and a molecular weight of 630 with the resin 5 or the resin 6.

The mixed resin was applied onto the separate film 5 by an applicator and dried for five minutes at 80° C. to form a second adhesive layer 6 having a thickness of 10 μm. A support plate 3 was bonded onto the second adhesive layer 6 formed on the separate film 5, and the separate film 5 was laminated onto the support plate 3 by a laminator at a pressure of 2.0 kg/cm$^2$, a speed of 0.5 m/min, and a temperature of 120° C. The addition of the terpene resins A to C led to improved laminatability.

Next, a 5-inch silicon wafer 2 was spin-coated with the adhesive composition 3, which was then dried for five minutes at 80° C. to form a first adhesive layer 4 having a thickness of 50 μm. Then, the separate film 5, onto which the support plate 3 had been laminated, was stuck onto the first adhesive layer 4 formed on the wafer 2, whereby a laminate 1 was formed. Table 4 shows combinations of materials used to form the laminates 1 in Examples.

TABLE 4

|  | Ex. 16 | Ex. 17 | Ex. 18 | Ex. 19 | Ex. 20 | Ex. 21 |
| --- | --- | --- | --- | --- | --- | --- |
| First adhesive layer | Resin 3 | Resin 3 | Resin 3 | Resin 3 | Resin 3 | Resin 3 |
| Separate film | PEN(25 μm) | PEN(25 μm) | PEN(25 μm) | PEN(25 μm) | PEN(25 μm) | PEN(25 μm) |
| Second adhesive layer | Resin 5 + Terpene A | Resin 5 + Terpene B | Resin 5 + Terpene C | Resin 6 + Terpene A | Resin 6 + Terpene B | Resin 6 + Terpene C |

(Evaluation of Removability)

The evaluation of removability was carried out by heating the laminates 1 of Examples 16 to 21 for one hour at 200° C., immersing them in p-menthane, subjecting them to ultrasonic treatment, and then removing the separate films 5. In each of Examples 16 to 21, the support plate 3 was removed from the wafer 2 satisfactorily. Further, the addition of the terpene resins A to C led to improved dissolubility of the second adhesive layers.

(Evaluation of Crack Resistance)

The laminates 1 of Examples 16 to 21 were formed so that their respective first adhesive layers 4 were 50 μm thick. These layers were checked with eyes for cracks. Examples 16 to 21 were all found to be free of cracks and therefore satisfactory in crack resistance.

(Evaluation of Sinking)

The evaluation of sinking was carried out by making a comparison between the thickness of the adhesive laminate 7 before heating of each of the laminates 1 of Examples 16 to and the thickness of the adhesive laminate 7 after heating of the laminate 1 for one hour at 200° C. In each of Examples 16 to 21, the difference between the thickness of the adhesive laminate 7 before heating and the thickness of the adhesive laminate 7 after heating was 10 μm or less. The amount of sinking in the adhesive laminate 7 was extremely small. The evaluation of sinking yielded a good result.

(Evaluation of Solvent Resistance)

The solvent resistance of each of the laminates 1 of Examples 16 to 21 to H$_2$O, IPA, PGMEA, NMP, DMSO, TMAH (2.38% by mass), NaOH (1% by mass), and HF (1% by mass) was evaluated. Each of the laminates 1 of Examples 16 to 21 was immersed in each of these solvents. In each of Examples 16 of 21, the adhesive laminate 7 did not dissolve in any of these solvents and therefore had resistance to the solvents.

(Evaluation of Film Contraction)

The evaluation of film contraction was carried out by heating the laminates 1 of Examples 16 to 21 for one hour at 200° C. and then observing the contraction state of the separate films 5. In each of Examples 16 to 21, the separate film 5 did not contract.

Comparative Examples 1 to 3

As Comparative Example 1, a laminate was formed by forming an adhesive layer on a wafer 2 with use of the adhesive composition 1 of the resin 1 and then bonding a support plate 3 onto the adhesive layer. As Comparative Example 2, a laminate was formed by forming an adhesive layer on a wafer 2 with use of the adhesive composition 1 of the resin 1, forming an adhesive layer on a support plate 3 with use of the adhesive composition 4 of the resin 4, and then bonding these adhesive layers together. As Comparative Example 3, a laminate was formed by forming an adhesive layer on a wafer 2 with use of the adhesive composition 3 of the resin 3, forming an adhesive layer on a support plate 3 with use of the adhesive composition 4 of the resin 4, and then bonding these adhesive layers together.

(Evaluation of Removability)

The evaluation of removability was carried out by heating the laminates 1 of Comparative Examples 1 to 3 for one hour at 200° C., immersing them in p-menthane, subjecting them to ultrasonic treatment, and then removing the support plate 3 from the wafer 2. In the laminate of Comparative Example 1, the support plate 3 removable from the wafer 2. However, in each of the laminates of Comparative Examples 2 and 3, the two adhesive layers were mixed together to make dissolution of the adhesive layers so difficult that the support plate 3 was not removed satisfactorily.

(Evaluation of Crack Resistance)

The laminates of Comparative Examples 1 to 3 were formed so that their respective adhesive layers were 50 μm thick. These layers were checked with eyes for cracks. The adhesive layer of Comparative Example 1 and the adhesive layer on the wafer 2 of Comparative Example 2 had cracks therein and therefore were not sufficient in crack resistance.

(Evaluation of Sinking)

The evaluation of sinking was carried out by making a comparison between the thickness of the adhesive layer(s) before heating of each of the laminates of Comparative Examples 1 to 3 and the thickness of the adhesive layer(s) after heating of the laminate for one hour at 200° C. In Comparative Example 1, the adhesive layer went down in thickness by 40 μm. In Comparative Examples 2 and 3, the adhesive layers went down in thickness by 25 μm and 20 μm, respectively.

(Evaluation of Solvent Resistance)

The solvent resistance of each of the laminates of Comparative Examples 1 to 3 to H$_2$O, IPA, PGMEA, NMP, DMSO, TMAH (2.38% by mass), NaOH (1% by mass), and HF (1% by mass) was evaluated. Each of the laminates of Comparative Examples 1 to 3 was immersed in each of these solvents, and the state of dissolution of each adhesive layer after one hour was observed. The laminate of Comparative Example 1 dissolved in PGMEA but did not dissolve in any of the other solvents. The laminates of Comparative Examples 2 and 3 did not dissolve in any of these solvents.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

INDUSTRIAL APPLICABILITY

A sticking method according to the present invention makes it possible to stick a support plate onto a substrate in such a way that the support plate can be removed quickly and easily by preventing one of the adhesive layers from sinking into the other. As such, the sticking method according to the present invention can be suitably applied, for example, to the production of miniaturized semiconductor devices.

REFERENCE SIGNS LIST

1 Laminate
2 Wafer (substrate)
3 Support plate
4 First adhesive layer
5 Separate film (separation film layer)
6 Second adhesive layer
7 Adhesive laminate

The invention claimed is:

1. A sticking method for sticking a support plate onto a substrate, the method comprising:
   a step of sticking the support plate onto the substrate via a first adhesive layer provided on the substrate, a separation film layer provided on the first adhesive layer, and a second adhesive layer provided on the separation film layer,
   wherein the first adhesive layer and the second adhesive layer dissolve in a solvent and the second adhesive layer is higher in rate of dissolution in the solvent than the first adhesive layer, or wherein the second adhesive layer dissolves in a solvent different from a solvent in which the first adhesive layer dissolves, and
   wherein the separation film layer is formed from a resin selected from the group consisting of a polyethylene resin, a polyimide resin (PI), a polyamide resin, polyethylene terephthalate (polyester resin (PET)), polyphenylene sulfide, polyethylene naphthalate (PEN), polypropylene resin, polybutylene resin, nylon, and a polylactide resin.

2. The sticking method as set forth in claim 1, further comprising, before the sticking step:
   forming the first adhesive layer on the substrate.

3. The sticking method as set forth in claim 1, further comprising, before the sticking step:
   forming the second adhesive layer on the support plate.

4. The sticking method as set forth in claim 1, wherein the separation film layer dissolves in neither the solvent that dissolves the first adhesive layer nor the solvent that dissolves the second adhesive layer.

5. The sticking method as set forth in claim 1, wherein the second adhesive layer is formed from a second adhesive compound whose average molecular weight is 10% to 30% of an average molecular weight of a first adhesive compound constituting the first adhesive layer.

6. The sticking method as set forth in claim 1, wherein the second adhesive layer is formed from a second adhesive compound containing a nonpolar-solvent dissolvable compound or a highly-polar-solvent dissolvable compound.

7. The sticking method as set forth in claim 6, wherein the nonpolar-solvent dissolvable compound is a resin having constituent units derived from cycloolefin.

8. The sticking method as set forth in claim 6, wherein the highly-polar-solvent dissolvable compound is selected from the group consisting of collagen peptide, cellulose, and polyvinyl alcohol (PVA).

9. The sticking method as set forth in claim 1, wherein the second adhesive layer is thinner in layer thickness than the first adhesive layer.

10. The sticking method as set forth in claim 1, wherein the support plate is provided with a plurality of through holes passing through a thickness of the support plate.

11. A sticking method for sticking a support plate onto a wafer, the method comprising:
    a step of sticking the support plate onto the wafer via a first adhesive layer provided on the wafer, a separation film layer provided on the first adhesive layer, and a second adhesive layer provided on the separation film layer,
    wherein the first adhesive layer and the second adhesive layer dissolve in a solvent and the second adhesive layer is higher in rate of dissolution in the solvent than the first adhesive layer, or wherein the second adhesive layer dissolves in a solvent different from a solvent in which the first adhesive layer dissolves, and
    wherein the separation film layer is formed from a resin selected from the group consisting of a polyethylene resin, a polyimide resin (PI), a polyamide resin, polyethylene terephthalate (polyester resin (PET)), polyphenylene sulfide, polyethylene naphthalate (PEN), polypropylene resin, polybutylene resin, nylon, and a polylactide resin.

* * * * *